(12) United States Patent
Wakabayashi

(10) Patent No.: US 7,129,645 B2
(45) Date of Patent: Oct. 31, 2006

(54) ELECTRO-OPTICAL DEVICE AND ELECTRONIC APPARATUS

(75) Inventor: Junichi Wakabayashi, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 69 days.

(21) Appl. No.: 11/106,542

(22) Filed: Apr. 15, 2005

(65) Prior Publication Data

US 2005/0285542 A1   Dec. 29, 2005

(30) Foreign Application Priority Data

Jun. 24, 2004   (JP)   ............... 2004-186358

(51) Int. Cl.
   *G09G 3/10*   (2006.01)
   *G09G 5/00*   (2006.01)
(52) U.S. Cl. ................... 315/169.3; 345/204
(58) Field of Classification Search ............ 315/169.3, 315/169.1, 156, 167; 345/204, 205, 206, 345/149, 156, 76, 97; 349/149, 151
See application file for complete search history.

(56) References Cited

U.S. PATENT DOCUMENTS 6,781,162 B1   8/2004   Yamazaki et al. .......... 257/184
6,946,802 B1 *   9/2005   Hayashi .................... 315/169.3
6,999,150 B1 *   2/2006   Murade ...................... 349/151
2003/0076460 A1 *   4/2003   Murade ...................... 349/111
2004/0141137 A1 *   7/2004   Hirabayashi ................ 349/149

FOREIGN PATENT DOCUMENTS

JP   A 2003-288994   10/2003

\* cited by examiner

*Primary Examiner*—Trinh Vo Dinh
(74) *Attorney, Agent, or Firm*—Oliff & Berridge, PLC

(57) ABSTRACT

To miniaturize an organic EL device and improve its reliability. An organic EL comprising: a second electrode formed to face against a plurality of first electrodes each of which is formed on each pixel and electronically connected to a pixel driving signal; a luminescent layer interposed between the first electrode and the second electrode; a plurality of input/output signal lines arranged in the peripheral region, one ends of which are electrically connected to the pixel driving signal lines and the other ends of which are electrically connected to external circuits; and a wiring line for the second electrode electrically connected to the second electrode in the peripheral region and, wherein, at least a part of the plurality of input/output signal is collected in the peripheral region in the direction from the one end to the other end to form a contact area, and the wiring line for the second electrode is electrically connected to the second electrode in the contact area.

6 Claims, 11 Drawing Sheets

ELECTRO-OPTICAL DEVICE AND ELECTRONIC APPARATUS

BACKGROUND

This invention relates to an organic EL (Electro-Luminescent) device and a various electronic apparatus employing the organic EL device.

As disclosed in Patent Document 1, this kind of organic EL device has, for example, an organic EL element as a luminescent element in each pixel in the image display region on a substrate. An organic EL element consists of anodes formed for every pixel, a cathode opposite to a plurality of anodes, and an organic EL layer interposed therebetween. In a peripheral region located around the image display region, there are a plurality of signal lines serving as a supply path of a driving signal for driving each pixel, and a cathode wiring line connected to the cathode of the organic EL element. According to the technique described in Patent Document 1, the cathode is electrically connected to a cathode wiring line formed below the cathode on a substrate with interposing a supplemental electrode in a connecting region located along one side of the image display region (see FIGS. 1(c) and 2 in Patent Document 1).

[Patent Document 1] Japan Unexamined Patent Application Publication No. 2003-288994.

In the case a plurality of signal lines are arranged under the cathode wiring line in the peripheral region on the substrate, as shown in the connecting region disclosed in Patent Document 1, a step could occur on the surface of the region where the cathode wiring line contacts with the cathode since the signal lines are arranged right under the contact area. This step causes an unfavorable influence in a protecting layer coating process and its etching process onto the surface of the contact area of the cathode wiring line at the time of manufacturing organic EL devices. That is, this step on the surface of the cathode wiring line can deteriorate the coating coverage of a protecting layer or an unnecessary area can be subject to erosion by etching. In this case, the manufacturing yield of the organic EL device may falls or the electrical connection between the cathode wiring line and the cathode may deteriorate to cause a malfunction. Moreover, such step makes the thickness of the cathode wiring line uneven. The uneven layer thickness makes resistance distribution uneven which causes current to be accumulated on a specific region with a low resistance to cause the organic EL device deteriorated. As the result, reliability on the organic EL device goes down.

On the other hand, when the area of the contact region is increased in order to ensure an enough capacity in the contact area of the cathode wiring line, the peripheral region is also increased and the size of the substrate should be enlarged, thus making difficult to miniaturize the organic EL device.

Under the reflection of these problems, the object of the present invention is to provide an organic EL device with a good electrical connection between the cathode wiring line and the cathode, a compact size, and a high reliability, and an electronic device employing such organic EL device.

SUMMARY

In order to achieve the above-mentioned object, the present invention provides an electro-optical device including: a plurality of pixel driving signal lines arranged in an image display region on a substrate; a plurality of first electrodes formed for each pixel in the image display region and electrically connected to the pixel driving signal lines; a second electrode formed on the opposite to the plurality of first electrodes and extended from the pixel display region to a peripheral region which is located around the pixel display region; a luminescent layer formed for each pixel with being interposed between the first electrode and the second electrode; a plurality of input/output signal lines arranged in the peripheral region, one end of which electrically connected to the pixel driving signal lines and the other end of which electrically connected to a external circuit for driving the pixel driving signal lines; and a wiring line for the second electrode arranged in the peripheral region and electrically connected to the second electrode, wherein, at least a part of the plurality of input/output signal is collectively arranged in the peripheral region in the direction from the one end to the other end to form a contact area on which no input/output signal lines exist, and the wiring line for the second electrode includes a contact which is positioned on the contact area so as to electrically connect the wiring line for the second electrode to the second electrode.

According to the electro-optical device of the present invention, in every pixel of the image display region on the substrate, a luminescent element including a luminescent layer interposed between the first electrode and the second electrode is arranged. The luminescent element is formed as an organic EL element including an organic EL layer as a luminescent layer. In addition, according to the present invention, the first and the second electrodes serve as a cathode and an anode for the organic EL element, respectively. The substrate and the first electrode are made of a transparent material, respectively, and the second electrode is made of an opaque conductive material such as a metal to obtain a bottom emission type organic EL device which emits the emission light of the organic EL element as display light into every pixel from the substrate. On the other hand, the substrate and the first electrode may made of an opaque material, respectively, and the second electrode may made of a transparent conductive material to obtain a top emission type organic EL device which emits the emission light of the luminescent element as display light into every pixel from the second electrode.

The first electrode of each luminescent element is electrically connected to the pixel driving signal line. Here, the pixel driving signal line is arranged in the image display region as a data line, scanning line or a power supply line. The second electrode is commonly arranged for the plurality of luminescent elements on the substrate and extended from the image display region to the peripheral region.

At the time of driving the organic EL device, the pixel driving signal line gets driven corresponding to the driving signal supplied from an external circuit into the input/output signal line arranged in the peripheral region as will be described below. Then, the luminescent element begins a luminescent operation as will be described below as the pixel driving signal line gets driven. That is, for example, when the data line and the scanning line for a luminescent element are driven, the luminescent layer of the luminescent element comes to emit corresponding to the current inputted into the first electrode of the luminescent element from the power supply line. Then current inputted into the second electrode via the luminescent layer is exhausted to outside of the organic EL device after passing through the wiring line for the second electrode connected to the second electrode as will be described below.

The plurality of input/output signal lines is arranged in the peripheral region on the substrate. One ends of the plurality of input/output signal lines are electrically connected to the pixel driving signal lines and the other ends are electrically connected to the external circuits from which, for example, driving signals are inputted. The plurality of input/output signal lines can serve as input only lines which just input the driving signal from the external circuit. On the other hand, it can also partially function output lines which output a control signal, inspection signal and so like into the external circuit. Here, What "electrically connected to the pixel driving signal lines" means includes the case when the plurality of input/output signal lines are directly connected to the plurality of pixel driving signal lines and the case when the plurality of input/output signal lines are connected to a driving circuit installed on or built in the substrate for driving the pixel driving signal lines. In the former case, an image signal for driving the data line, a scanning signal for driving the scanning line and pixel driving power supply for driving the power supply line are supplied into the plurality of input/output signal lines as driving signals. In the latter case, a power supply for driving the driving circuit and various signals are supplied into the plurality of input/output signal lines as driving signals.

According to the present invention, especially, the plurality of input/output signal lines is collectively arranged at least partially in the peripheral region in the direction from the one end to the other end. Here, what "is collectively arranged" means is that the other ends of two or more input/output signal lines are arranged with being electrically separated so that the arrangement pitch or the arrangement interval in the other end is shorter than that in the one end, and thus making the two or more input/output signal lines collected on its other ends.

When the two or more input/output signal lines are collectively arranged on the other end as described above, on the plan view toward the substrate, an "open area" where no input/output signal lines exist becomes formed in the peripheral region. Meanwhile, the meaning of "open area" also includes any area where no input/output signal lines exist regardless of whether they are "collectively arranged" or not.

The above mentioned "open area" becomes the contact area where the wiring line for the second electrode and a part of the second electrode which extends to be formed in the peripheral region are electrically connected. More specifically, the contact of the wiring line for the second electrode is formed so that its surface is exposed to the contact area and a part of the second electrode which is located in the peripheral region is disposed so as to be overlapped on the contact or electrically connected thereto by interposing a conductive material. As the result, the second electrode and the wiring line for the second electrode are electrically connected.

Thus, in the case when the plurality of input/output signal lines are formed above the wiring line for the second electrode on the substrate, no input/output signal line is arranged right below the contact of the wiring line for the second electrode. That is, there is no unevenness caused from the existence of the input/output signal lines on the surface of the wiring line for the second electrode disposed on the contact area. Thus, it is possible to form the surface of the contact of the wiring line for the second electrode flat since it is formed on a surface where there is no unevenness or unevenness is rarely existed. Here, what the "flat" means is that the unevenness on the surface of the contact of the wiring line for the second electrode is within the limit of the process variation for forming the wiring line for the second electrode. In addition, since the other ends of at least a part of the plurality of input/output signal lines are collectively arranged, the contact area can be vary without varying the size of the peripheral region. In other words, the more the degree of "collectively arranged," the larger the size of the contact area can be. Thus, capacitance sufficient to make sure the electrical connection between the contact and the second electrode in the contact area can be obtained.

As described above, according to an electro-optical device of the present invention, it is possible to make the electrical connection between the wiring line for the second electrode and the second electrode good in the peripheral region on the substrate.

The other ends of the plurality of input/output signal lines are connected to, for example, a plurality of loading terminals which load the external circuits for supplying the driving signals. Here, it is possible to vary the pitch of the plurality of loading terminals or the size of the plurality of external circuits by dividing the plurality of input/output signal lines into a plurality of signal line groups, each of which comprises one or more input/output signal lines and then collectively arranging the other end of each signal line group.

According to an organic EL device of the present invention as described above, miniaturization can be realized and reliability also can be improved as well at the same time.

As an embodiment of the present invention, a structure is presented where the other ends of the plurality of input/output signal lines are collectively arranged on one side around the image display region which falls within a part of the peripheral region, and the contact area is located in the part of the peripheral region.

According to this embodiment, the other ends of the plurality of input/output signal lines disposed on one side of around the image display region which is a part region of the peripheral region are arranged with being collectively arranged. Thus, in the part region, the open area formed on the both sides of the input/output signal lines on the substrate by narrowing the input/output signal lines the other ends of which are collectively arranged can be served as a contact area. On the other hand, in the part region, the open area formed on the substrate by collectively arranging the other ends of the input/output signal lines on one side of the part region can be used as contact area.

As another embodiment of the present invention, a structure is presented where the plurality of input/output signal lines are divided into a plurality of signal line groups containing a part of the plurality of input/output signal lines, the other end of each signal line group is collectively arranged, and the contact area is formed between two adjacent signal line groups.

According to this embodiment, the other ends of the plurality of input/output signal lines are collectively arranged in every signal line group. Since the other ends of the input/output signal lines which are collectively arranged are connected to loading terminals respectively, the structure of the loading terminals may be changeable. More specifically, for example, a wiring substrate made by arranging a wiring on a flexible substrate can be allotted for every single signal line group. In this case, the wiring substrate is mounted in each loading terminal after mounting the external circuit in the wiring substrate. In addition, a wiring substrate containing external circuit can also be allotted for a predetermined number of signal line groups so that a wiring substrate can be mounted in loading terminals corresponding to a predetermined number of signal line groups.

As another embodiment of the present invention, a structure is presented where the wiring line for the second electrode is formed with extending from the contact to a part of the peripheral region on which the plurality of input/output signal lines are arranged.

According to this embodiment, the wiring line for the second electrode is arranged so as to be across or overlapped with the plurality of input/output signal lines. Thus, in the crossing area or the overlapping area, the wiring line for the second electrode is formed on a different layer on the substrate from the layer where the input/output signal lines are formed. According to this embodiment, since the area of the wiring line for the second electrode can be bigger relatively, the resistance on the wiring line for the second electrode can be decreased. Therefore, according to this embodiment, even though a voltage slope arises by the unevenness of the voltage value applied to the wiring line for the second electrode at the driving process of the organic EL device, the influence due thereto can be controlled so as not to affect the luminescent function of each luminescent element.

As another embodiment of the present invention, a structure is presented where the plurality of input/output signal lines are formed under the wiring line for the second electrode on the substrate, and the wiring line for the second electrode is formed in a part region of the peripheral region on which the plurality of input/output signal lines are arranged, and extended over the plurality of input/output signal lines with interposing an interlayer insulating layer in the direction across or along the input/output signal lines.

According to this embodiment, in the crossing or overlapping area with the input/output signal lines, the wiring line for the second electrode is formed over the input/output signal lines on the substrate. Under this structure, since there is no signal line right below the contact of the wiring line for the second electrode, the surface of the wiring line for the second electrode can be formed flat.

In order to achieve the above-mentioned object, an electronic device according to the present invention employs such an electro-optical device according to the present invention (including the above-mentioned various embodiments) as described above.

Since an electronic apparatus according to the present invention employs the above-mentioned electro-optical device, it can be miniaturized and its reliability can be also improved at the same time. This technology can be applied for a various electric apparatus such as the television, a cellular phone, an electronic notebook, a word processor, a view finder type or a monitor type video tape recorder, a workstation, a TV phone, a POS terminal, and a touch panel. Moreover, it is also possible as an electric apparatus according to this invention to realize for example, an electronic discharge equipment (Field Emission Display and Conduction Electron-Emitter Display) etc.

The operation and the advantages of the present invention will be clarified through the following embodiments.

DETAILED DESCRIPTION OF EMBODIMENTS

Hereinafter, embodiments according to the present invention will be described in detail with reference to the accompanied drawings.

<1: First Embodiment>

A first embodiment of an organic EL device according to the present invention will be described with reference to FIGS. 1 to 8.

<1-1: Overall Structure of Organic EL Device>

Figure 1:
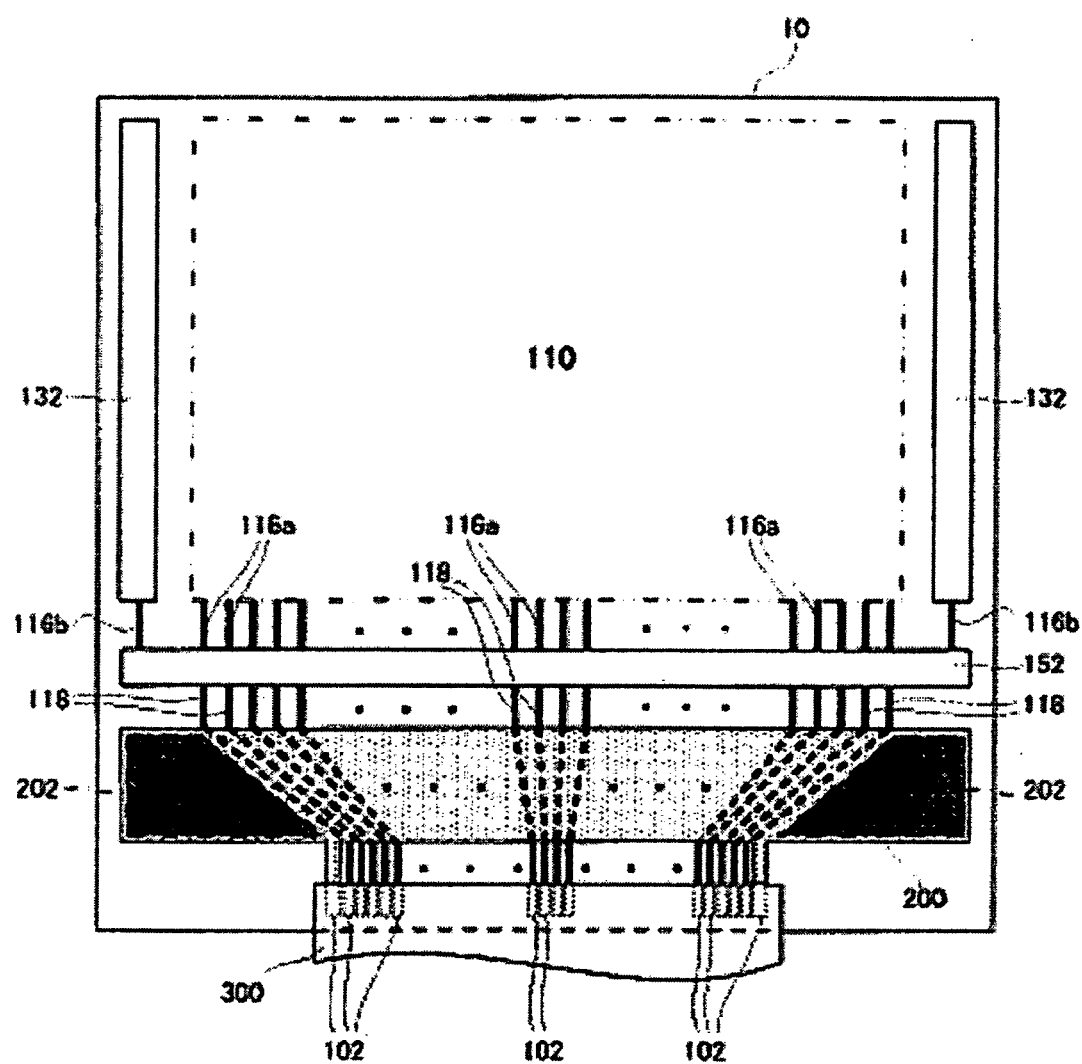
FIG. 1 is a schematic plan view of an organic EL device.

First, with reference to FIG. 1, an overall structure of the organic EL device will be described. FIG. 1 is a schematic plan view of the organic EL device obtained when an element substrate is viewed from a sealing substrate side. Here, an organic EL device of a drive circuit built-in type active-matrix drive system will be exemplified as an example of the present invention.

With reference to FIG. 1, in an image display region 110 on the element substrate 10, a plurality of pixel diving signal lines 116a are arranged and a plurality of pixel units, which are electrically connected to the pixel driving signal lines 116a, respectively, are arranged in a predetermined pattern. Each pixel unit contains an organic EL element. In the FIG. 1, detailed structures of the pixel driving signal lines 116a and pixel units are not shown and will be described below.

On a peripheral region which is located around the image display region 110, Y-side driving circuit units 132 are respectively formed along the two sides of the element substrate 10 which are opposite to each other with disposing the image display region 110 therebetween, and an X-side driving circuit unit 152 is formed along one side adjacent to the two sides. The plurality of pixel driving signal lines 116a are electrically connected to the Y-side driving circuit units 132 and the X-side driving circuit unit 152. As shown in FIG. 1, a part of the plurality of pixel driving signal lines 116a, which are electrically connected to the X-side driving circuit unit 152, is extended from one side of the image display region 110 to the X-side driving circuit unit 152. In addition, a plurality of loading terminals 102 are arranged along the one side of the element substrate 10 on which the X-side driving circuit unit 152 is arranged.

On the Y-side driving circuit unit 132, a scanning driving circuit is arranged and other various wiring lines are arranged, for example, wire for electrically connecting the pixel driving signal lines 116a and circuit elements contained in the scanning driving etc., a wire serving as a supply path for various signals for driving the scanning driving circuit and so on. On the X-side driving circuit unit 152, a data line driving circuit is arranged and other various wires are arranged, for example, wires for electrically connecting the pixel driving signal lines 116a with circuit elements within the scanning driving circuit etc., wires serving as a supply path for various signals for driving the data driving circuits and the like. In addition, a wire arranged on the Y-side driving circuit unit 132 can extend to the X-side driving circuit unit 152 and at the same time, a wire arranged on the X-side driving circuit unit 152 can extend to the Y-side driving circuit unit 132 as well. As an example of such wire, FIG. 1 shows the wire 116b which extends from the Y-side driving circuit unit 132 to the X-side driving circuit unit 152. This wire 116b can be, for example, electrically connected to the input/output signal lines 118 through the X-side driving circuit unit 152.

In addition, on a part of the peripheral region on the element substrate 10 which is located on one side of the image display region 110 where the X-side driving circuit unit 152 is arranged, the plurality of input/output signal lines 118 and a cathode wire 200 which serves as a "wiring line for the second electrode" according to the present invention are arranged. In the plurality of loading terminals 102, a wire substrate 300 is arranged in TAB (Tape Automated Bonding) type or COG (Chip On Grass) type. An external circuit for supplying various signals for driving the scanning line driving circuit or the data line driving circuit is mounted on the wire substrate 300. One ends of the plurality of input/output signal lines 118 are electrically connected to the X-side driving circuit unit 152 and the Y-side driving circuit unit 132. As shown in FIG. 1, a part of the plurality of input/output signal lines 118 are electrically connected to the Y-side driving circuit unit 132 through the wire 116b which extends from the Y-side driving circuit unit 132 to the X-side driving circuit unit 152 as described above. The other ends of the plurality of input/output signal lines 118 are electrically connected to the loading terminals 102.

As will be described below, the cathode wire 200 is formed under the plurality of input/output signal lines 118 on the element substrate 10. A contact area 202 is formed on the element substrate 10 and the cathode wire 200 is electrically connected to a cathode (not shown in FIG. 1) which serves as a "second electrode" according to the present invention on the contact area 202 in a way as will be described below. The cathode is formed on a sealing substrate (not shown in FIG. 1) facing against to the element substrate 10. The cathode wire 200 is also electrically connected to the loading terminals 102.

<1-2: Structure of Pixel Part>

Figure 2:
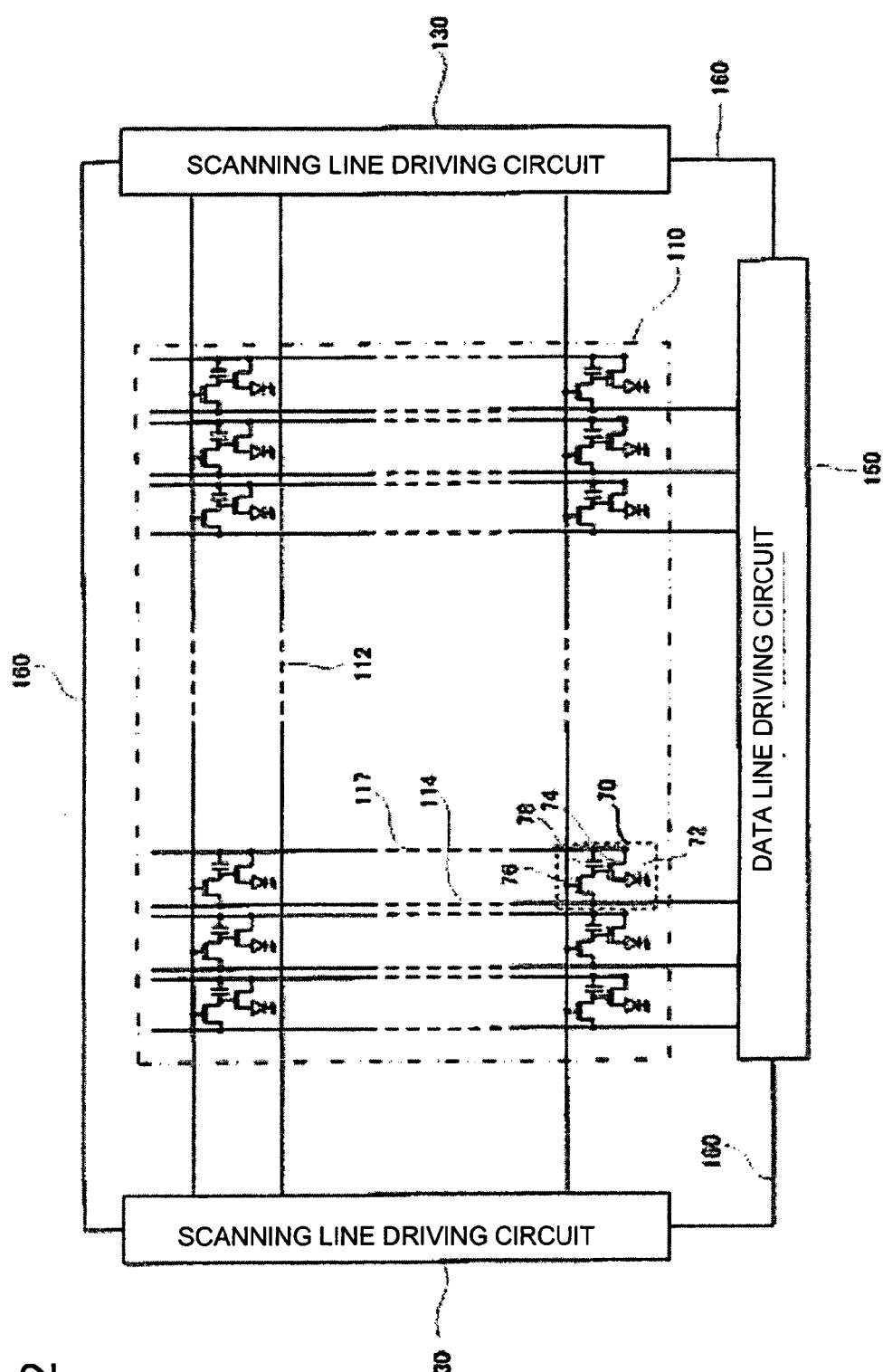
FIG. 2 is a block diagram showing the overall structure of the organic EL device.
Figure 3:
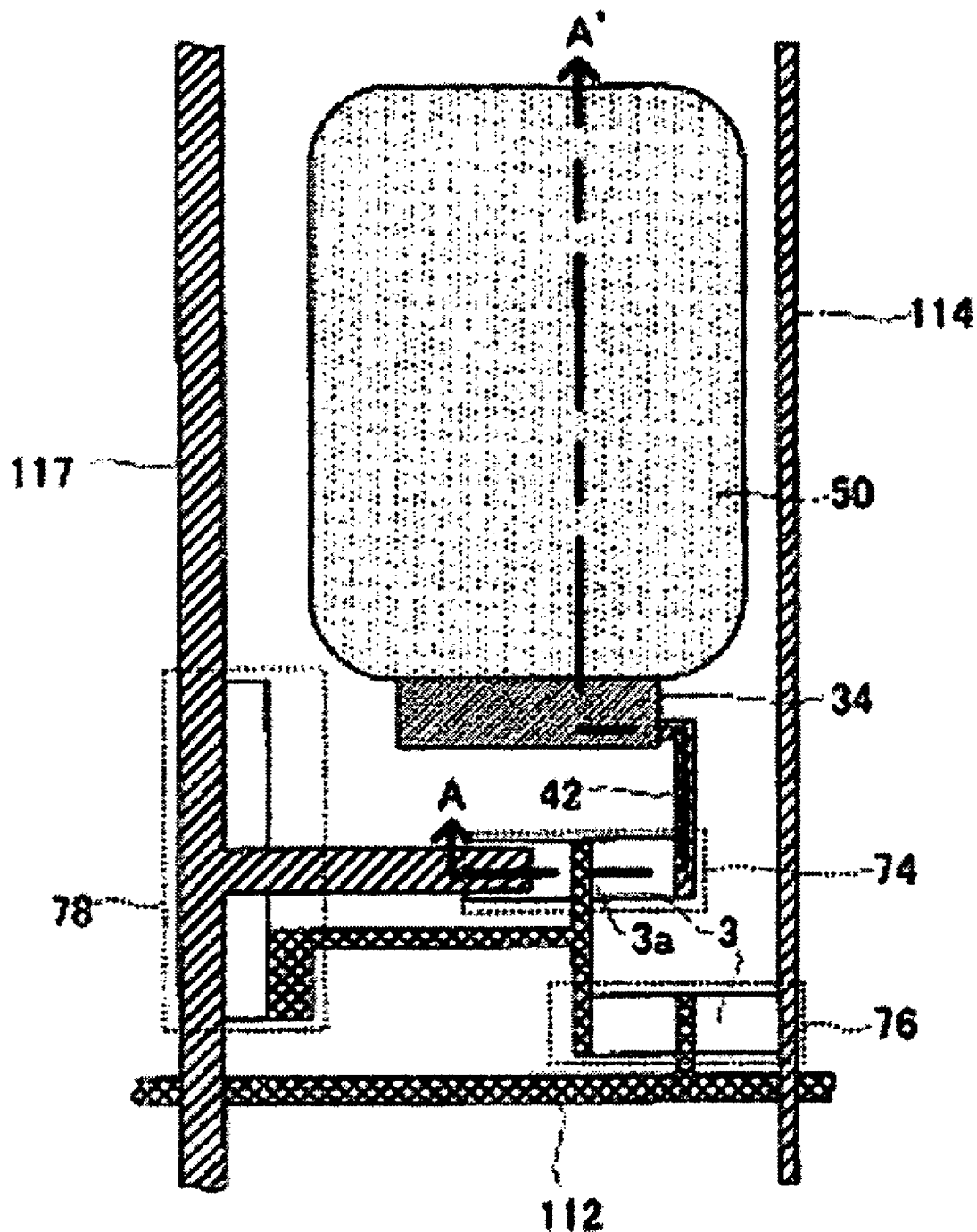
FIG. 3 is a plan view of a pixel part on an element substrate.
Figure 4:
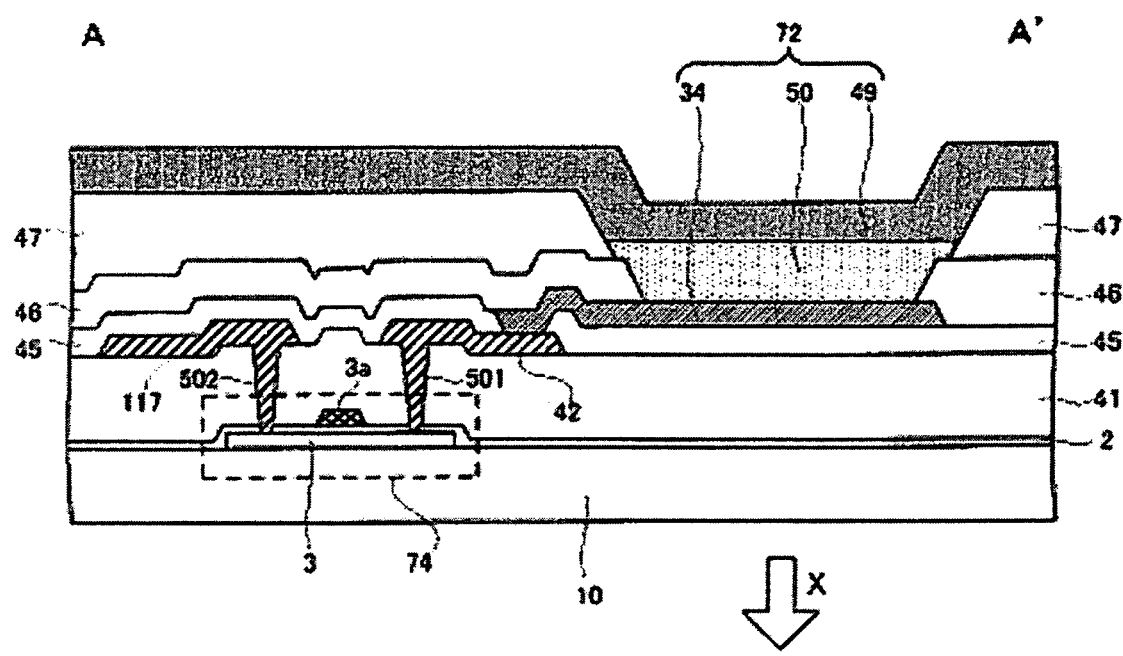
FIG. 4 is a A–A' sectional view of the pixel part shown in FIG. 3.

Next, with reference to FIGS. 2 to 4, a detailed structure of the pixel part of the image display region 110 according to the present organic EL device will be described. FIG. 2 is a block diagram showing the overall structure of an organic EL device, FIG. 3 is a plan view of a pixel part on an element substrate on which a data line, a scanning line, the anode, the luminescent layer, etc. are formed, and FIG. 4 is an A–A' sectional view of the pixel part shown in FIG. 3. In FIGS. 3 and 4, to make each layer or each member to be sufficiently understandable size, each layer or each member is shown in a different reduced scale.

First, with reference to FIG. 2, the electrical structure of the image display region 110 of the organic EL device will be explained.

On the image display region 110 of the organic EL panel 100, as the pixel driving signal lines 116a, data lines 114 are vertically arranged and scanning lines 112 are horizontally arranged. Pixel units 70 corresponding to intersections between the data lines and the scanning lines is arranged in a matrix shape. On the image display region 110, a power supply line 117 corresponding to the pixels 70 each of which arranged corresponding to each data line 114 is arranged on the image display region 110.

As shown in FIG. 2, scanning line driving circuits 130 and data line driving circuit 150 are arranged on the peripheral region. With respect to various signals supplied from external circuits via the loading terminals 112 and the input/output signal lines 118, as shown in FIG. 1, the scanning line driving circuit 130 supplies a scanning signal to a plurality of scanning lines 112 one by one, and the data line driving circuit 150 supplies an image signal to a plurality of data lines 114 one by one through the loading terminals 102 shown in the FIG. 1 and the input/output signal lines 118. The two sorts of operation, that is, the operations of the two scanning line driving circuits 130 and the operation of the data line driving circuit 150 are mutually synchronized by the synchronized signal 160 supplied from an external circuit. Moreover, a pixel driving power supply is supplied to the plurality of power supply lines 117 from an external circuit.

Here, a detailed structure of one pixel 70 shown in FIG. 2 is as follows. In the each pixel 70, an organic EL element 72, a switching transistor 76 constituted, for example, using TFT, a driving transistor 74, and the maintenance capacity 78 are provided. Each transistor on the pixel part 70 is constituted by TFT (Thin Film Transistor; hereinafter, referred to "TFT") etc.

The scanning line 112 is electrically connected to the gate electrode of the switching transistor 76, the data line 114 is electrically connected to the source electrode of the switching transistor 76, and the gate electrode of the driving transistor 74 is electrically connected to the drain electrode of the switching transistor 76. Moreover, the power supply line 117 is electrically connected to the source electrode of the driving transistor 74, and the anode of the organic EL element 72 is electrically connected to the drain electrode of the driving transistor 74.

Besides the structure of the pixel circuit shown in FIGS. 2 and 3, various type of pixel circuits can be adoptable, for example, a current program type pixel circuit, a voltage program type pixel circuit, a voltage comparison type pixel circuit, a sub frame type pixel circuit etc.

Next, with reference to FIGS. 3 and 4, the detailed structure of the pixel part 70 will be explained.

For example, on the element substrate 10 made of a transparent substrate such as a transparent resin substrate and a glass substrate, a semiconductor layer 3 is formed for the switching transistor 76 and the driving transistor 74. The semiconductor layer 3 may be formed, for example, using a low-temperature poly silicone film. Moreover, a gate insulating layer 2 for the switching transistor 76 and the driving transistor 74 is formed on the semiconductor layer 3 in the form of covering the semiconductor layer 3. A gate electrode 3a of the driving transistor 74 and the scanning line 112 are formed on the gate insulating layer 2. A part of the scanning line 112 serves as the gate electrode of the switching transistor 76. The gate electrode 3a and the scanning line 112 are formed using metal containing at least one of Al (aluminum), W (tungsten), Ta (tantalum), Mo (molybdenum), Ti (titanium), Cu (copper) etc.

Moreover, an interlayer insulating layer 41 is formed on the gate insulating film 2 so as to cover the scanning line 112 and the gate electrode 3a of the driving transistor 74. The interlayer insulating layer 41 and the gate insulating layer 2 can be made of, for example, a silicone oxide film.

On the interlayer insulating layer 41, the data line 114, the power supply line 117, and the drain electrode 42 of the driving transistor 74 each of which is made of a conductive material, for example, containing Al (aluminum) or ITO (Indium Tin Oxide) are formed. Contact holes 501 and 502 are formed in the interlayer insulating layer 41, each of which penetrates the interlayer insulating layer 41 and the gate insulating layer 2 from the surface of the interlayer insulating layer 41 to get to the semiconductor layer 3 of the driving transistor 74. As shown in FIG. 4, the power supply line 117 and the drain electrode 42 are formed so as to get to the surface of the semiconductor layer 3 through the contact holes 501 and 502, respectively.

Here, a lower capacity electrode for the maintenance capacity 78 is formed in the same layer as the scanning line 112 using, for example, the same material, and a part of the power supply line 117 serves as an upper capacity electrode for the maintenance capacity 78. The interlayer insulating layer 41 is formed using a dielectric film, and a part of the interlayer insulating layer 41 is interposed between the lower capacity electrode and the upper capacity electrode.

A protecting layer 45 is formed on the interlayer insulating layer 41 using, for example, silicon nitride (SiN) in the form of covering the power supply line 117 and the drain electrode 42. A hydrophilic layer 46 with a higher hydrophilic property than a luminescent material protecting layer 47 is formed on the protecting layer 45 using, for example, a silicon oxide (SiO) and the luminescent material protecting layer 47 is formed on the hydrophilic layer 46. The open area is formed on the pixel part 70 by the hydrophilic layer 46 and the luminescent material protecting layer 47. An anode serving as the "first electrode" according to the present invention is formed on the protecting layer 45 in the open area. The anode 34 made of a transparent conductive material, ITO, is extended from the open area to be overlapped with a part of the drain electrode 42. Moreover, an organic EL layer 50 is formed on the anode 34 in the open area. The organic EL element 72 contains the anode 34, the cathode 49, and the organic EL layer 50 interposed between the anode 34 and the cathode 49. A sealing substrate is not shown in FIG. 4. The cathode is formed of, for example, a metal containing aluminum (Al), or laminated layers of conductive films each of which consists of metal containing at least one of calcium (Ca), Lithium fluoride (LiF), strontium fluoride (SrF2), magnesium (Mg), silver (Ag), etc.

At a driving state of the organic EL device, the scanning signal is supplied through the scanning line 112 and thereby, the switching transistor 76 turns on. When the switching transistor 76 turns on, an image signal is inputted into the maintenance capacitor 78 from the data line 114. Corresponding to the current of the image signal inputted into the maintenance capacitor 78, the electric continuity state of the driving transistor 74 is decided. When the current corresponding to the image signal inputted into the maintenance capacitor 78 is supplied from the power supply line 117 to the anode 34 of the organic EL element 72 through the channel of the driving transistor 74, the organic EL layer 50 emits light corresponding to the supplied current. The current inputted to the cathode 49 through the organic EL layer 50 is discharged out of the organic EL device from the cathode 49 through the cathode wiring line 200 and the loading terminal 102. Since the organic EL device according to this embodiment is a bottom emission type, as shown by arrow X in FIG. 4, the emitting light of the organic EL element 72 is emitted as display light from the element substrate 10. However, the organic EL device according to this embodiment can be designed as a top emission type which emits the emitting light of the organic EL element 72 from the sealing substrate as display light.

21 1-3: Structure of Peripheral Region>

Figure 5:
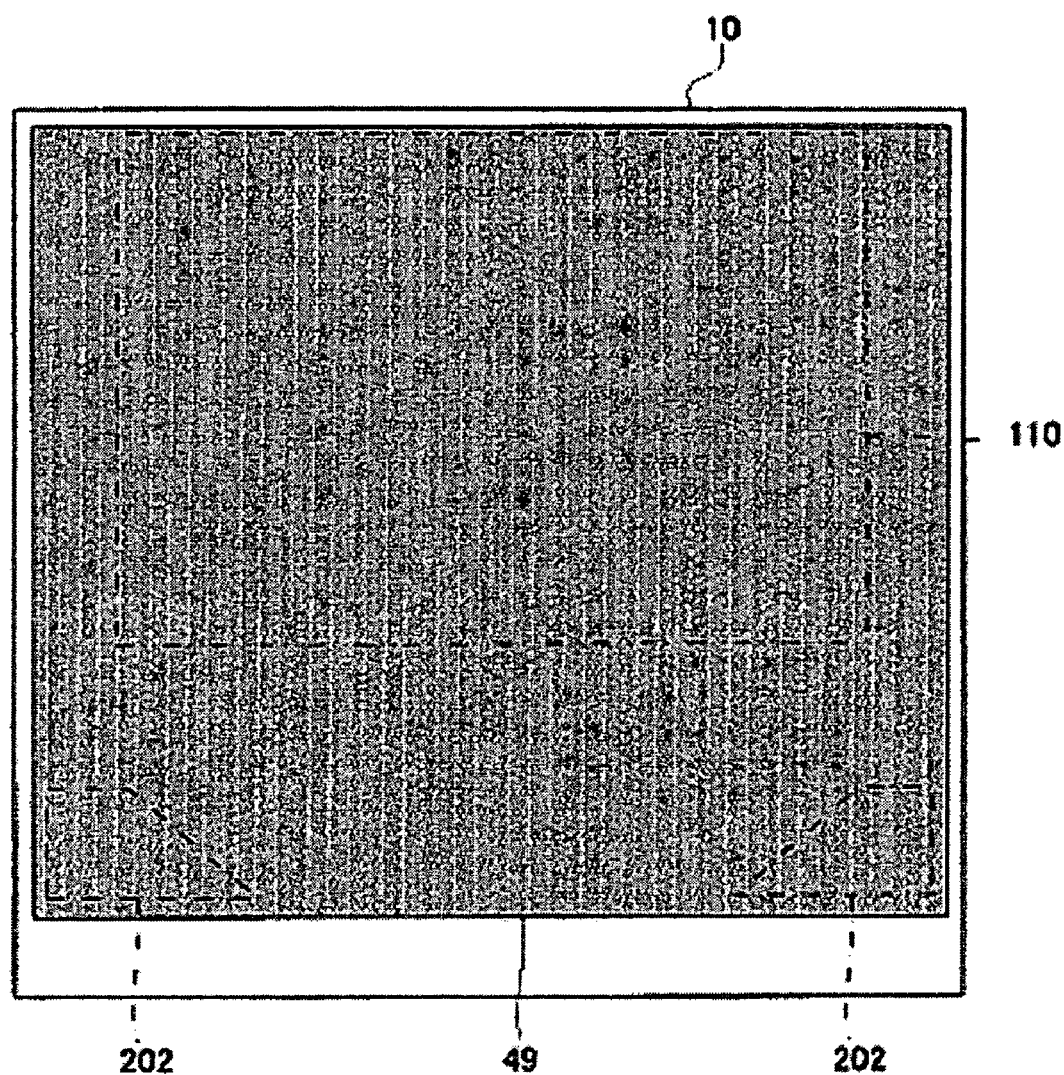
FIG. 5 roughly shows the structure of a cathode.
Figure 6:
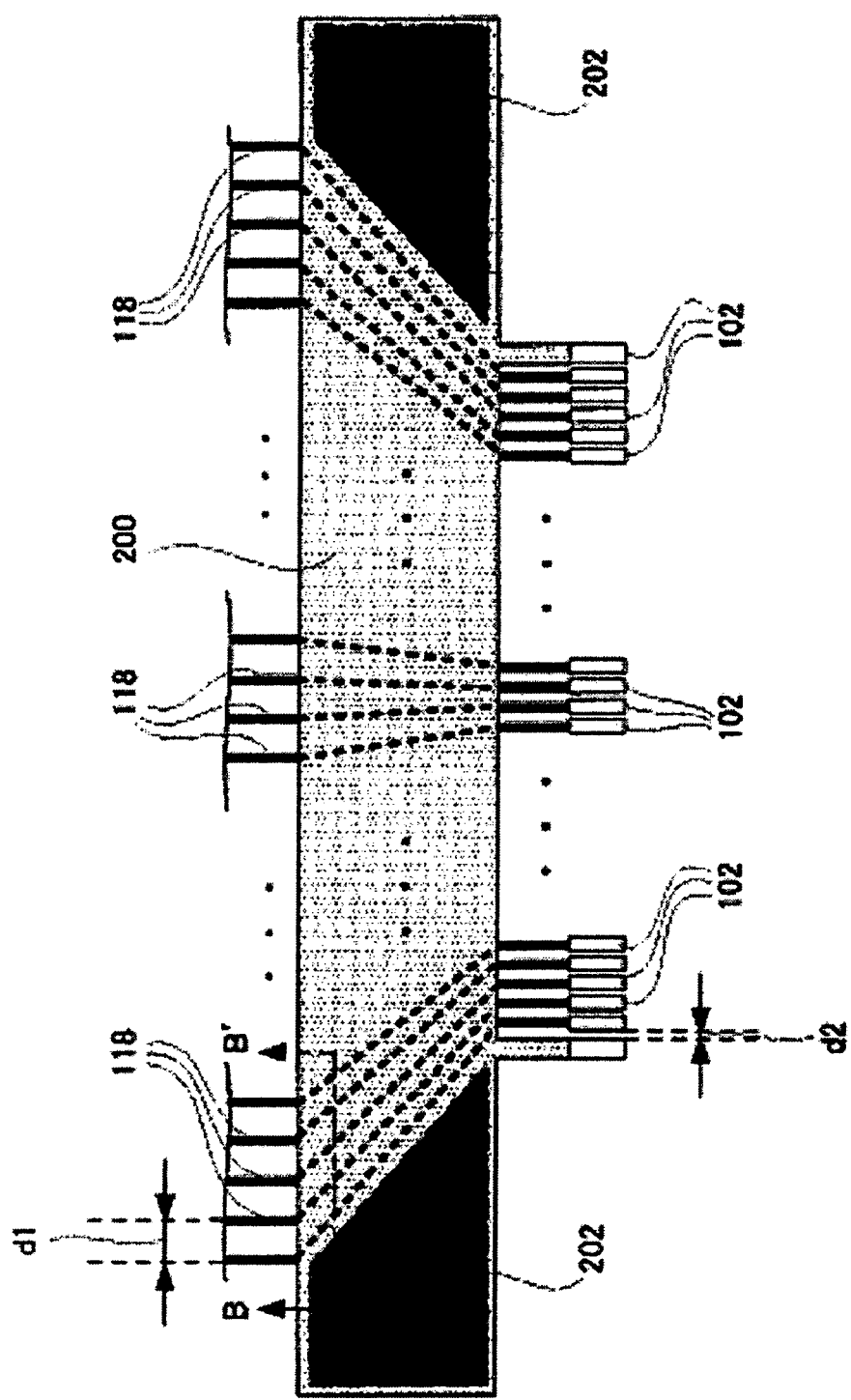
FIG. 6 shows an arrangement among a cathode wiring line, a contact area, and input/output signal lines and structure thereof.
Figure 7:
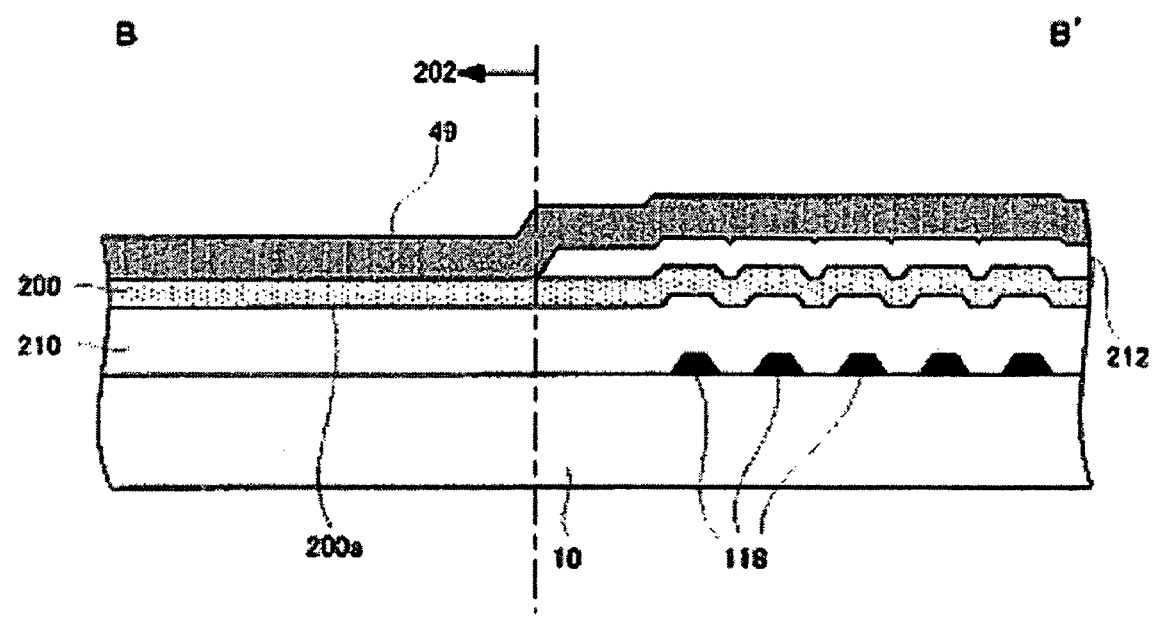
FIG. 7 is a sectional view along the B–B' line shown in FIG. 6.
Figure 8:
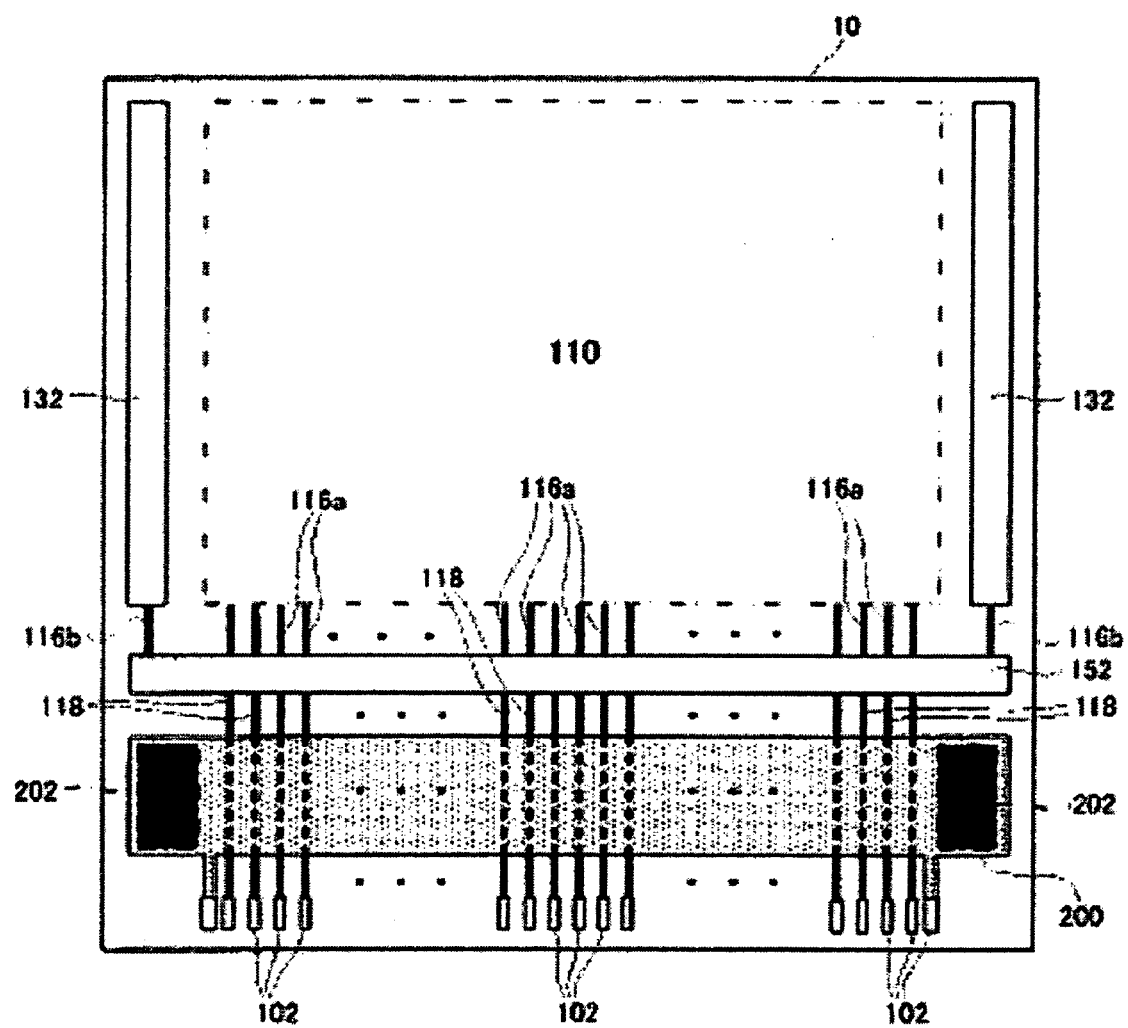
FIG. 8 is a rough plan view showing the structure of an organic EL device exemplified as a comparative example.

Next, with reference to FIG. 1 and FIGS. 5 to 8, the structure of the input/output signal line 118 and the cathode wiring line 200 in the peripheral region of the organic EL device will be described. The structure of the cathode 49 on the element substrate 10 is schematically shown in FIG. 5, and the relative arrangement among the cathode wiring line 200, the contact area 202, and the input/output signal line 118 and the structures thereof are schematically shown in FIG. 6. FIG. 7 is a sectional view along the B–B' line shown in FIG. 6, and FIG. 8 is a schematic plan view showing a structure of an organic EL device exemplified as an comparative example.

Referring to FIG. 5, the cathode 49 formed on the sealing substrate (not shown in FIG. 5) is formed over all the organic EL elements 72 formed on the image display region 110, and extends from the image display region 110 to the peripheral region. A part of the cathode 49 is formed so as to contain the contact area 202 on the element substrate 10. For the organic EL device according to this embodiment, instead of the sealing substrate, a sealing film may be formed on the cathode 49 to seal each organic EL element 72.

According to the present embodiment, in the peripheral region, at least a part of the plurality of input/output signal lines 118 is partially collected from one end which is electrically connected to the X-side driving circuit unit 152 and the Y-side driving circuit unit 132 towards the other end which is connected to the loading terminal 102. As shown in FIGS. 1 and 6, in a partial region of the peripheral region, the other end of the plurality of input/output signal lines 118 are arranged to be collected. Thus, as shown in FIG. 6, comparing with the wiring interval d1 between two adjacent input/output signal lines 118 on the one end, the wiring interval d2 between two loading terminals 102 which are connected to the other end of the two adjacent input/output signal lines 118 respectively is narrower. In addition, the interval d2 between the two adjacent loading terminals can be adjusted into a predetermined value by changing the wiring interval of the other end of the plurality of input/output signal lines 118, and it is also possible to make the interval d2 different in a part of the plurality of the loading terminals or in every two adjacent loading terminals different. In the same way, the interval d1 of the one end among the plurality of input/output signal lines 118 can be set into a predetermined value or designed to be different in a part of the plurality of input/output signal lines 118 or in every two adjacent input/output signal lines 118.

When the other ends of the plurality of input/output signal lines 118 are collected as mentioned above, there is no input/output signal line 118 on the element substrate 10, in a plan view. That is, the "open area" serving as a contact area 202 is formed in a part of the peripheral region. As shown in FIGS. 1 and 6, the contact areas 202 in a part of the peripheral region are formed on the both sides of the plurality input/output signal lines 118. As shown in FIGS. 1 and 6, the cathode wiring line 200 in the peripheral region is formed so as to contain the contact area 202 on the element substrate 10.

FIG. 7 is a sectional view along the B–B' line shown in FIG. 6 and shows element parts including the element substrate 10. As shown in FIG. 7, the plurality of input/output signal lines 118 are formed on the element substrate 10 in a part of the peripheral region. The plurality of input/output signal lines 118 are formed of metal containing at least one of Al (aluminum), W (tungsten), Ta (tantalum), Mo (molybdenum), Ti (titanium), Cu (copper), etc. Moreover, the interlayer insulating layer 210 is formed of a silicone oxide film or a silicone nitride film so that the plurality of input/output signal lines 118 can be embedded. Then, the cathode wiring line 200 is formed on the interlayer insulating layer 210 using a conductive material such as Al (aluminum) and ITO. The cathode wiring line 200 is extended, as shown in FIGS. 1 and 6, from a contact 200a arranged in the contact area 202 to the plurality of input/output signal lines 118 in the peripheral region. The protecting layer 212 consisting of, for example, a silicone oxide film or a silicone nitride film is formed on the area where cathode wiring line 200 is formed across or overlapped with the plurality of input/output signal line 118. The cathode 49 is formed on the protecting layer 212 so as to be overlapped with the contact part 200a of the cathode wiring line 200.

According to the present embodiment, the input/output signal lines 118 do not exist right under the contact 200a of the cathode wiring line 200 arranged in the contact area 202. That is, as shown in FIG. 7, the surface of the interlayer insulating layer 210 arranged in the contact area 202 has no unevenness since there is no the input/output signal line 118 thereunder. Thus, it is possible to make flat the surface of the contact 200a of the cathode wiring line 200.

FIG. 8 shows a conventional structure as a comparative example in which the plurality of input/output signal lines 118 formed in the peripheral region located along one side of the image display region 110 where the X-side driving circuit unit 152 is formed are arranged in a straight form along the perpendicular direction of the image display region, instead of being collected, as shown in FIGS. 1 and 6. According to the example of comparison shown in FIG. 8, in the plan view of the element substrate 10, the contact area 202 is formed on the open area in a part of the peripheral region in which the input/output signal lines 118 do not exist. In this case, it is possible to make flat the surface of the contact 200a of the cathode wiring line 200 on the contact area 202 obtained like this, as same as the embodiment according to the present invention. However, in this case, when the size of the contact area 202 is changed, the size of the part of the peripheral region is also subject to change to make the size of the element substrate 10 bigger.

On the other hand, according to an embodiment of the present invention, since the plurality of input/output signal lines 118 are designed to be collectively arranged in a part of the peripheral region, the size of the contact area 202 can be secured relatively larger than that of the comparative example shown in FIG. 8. Therefore, it is possible to secure a sufficient current capacity for a good electrical connection between the contact 200a of the cathode wiring line 200 and the cathode 49 in the contact area 202. As described above, this embodiment of the present invention make the electrical connection between the cathode wiring line 200 and the cathode 49 good in the part of the peripheral region. Meanwhile, according to this embodiment, the wiring length for each input/output signal line 118 may be longer, and thus its resistance may also become larger, compared with the comparative example shown in FIG. 8. However, its influence on the luminescent function of each organic EL element 72 can be insignificant by adjusting the resistance of the input/output signal line 118 into a value smaller enough than the resistance of the organic EL layer 50 of the organic EL element 72 at its driving time.

Moreover, since the cathode wire ling 200 is extended from the contact 200a to the region where the plurality of input/output signal lines 118 are arranged in the peripheral region, it is possible to make the size of the cathode wiring line 200 relatively bigger in a plan view. Thus, the resistance of the cathode wiring line 200 can be low. Moreover, even when a voltage becomes unstable in the cathode wire 200 at the driving time of the organic EL device to cause a voltage slope, it is possible to control the influence on the luminescent function of each organic EL element 72 in some degree.

Therefore, according to the above-mentioned embodiment of the present invention, organic EL device with a compact size and improved reliability can be realizable.

In addition, according to the present invention, since the contact area 202 can be formed in a size securable to keep sufficient capacitance for electrical connection between the cathode wiring line 200 and the cathode 49, the cathode wiring line 200 may be designed to be formed only in the contact area 202 on the element substrate 10.

Moreover, the contact area 202 is designed to be formed just in one side of the plurality of input/output signal lines 118 on a part of the peripheral region while the other end of each input/output signal line 118 is collectively arranged. Furthermore, it is possible to design so that only a part of the other ends of the plurality of input/output signal lines 118 can be collectively arranged in the part of the peripheral region. In this case, among the plurality of input/output signal lines 118, there are ones whose other end is not collected.

Moreover, the X-side driving circuit unit 152 can be formed on the opposite side of the image display region 110 to the side thereof where the X-side driving circuit unit 152 in shown in FIG. 1 is arranged, or on the both sides of the image display region 110. In this case, the plurality of input/output signal lines 118, the cathode wiring line 200, and the plurality of loading terminals 102 are also formed on the peripheral region located on the opposite side of the image display region 110 where the X-side driving circuit unit 152 is arranged in the same way as shown in FIG. 1.

Furthermore, the loading terminal 102 formed on one side of the element substrate 10 where the X-side driving circuit unit 152 is arranged may be designed to be formed on the both sides of the element substrate 10 where the Y-side driving circuits 132 are respectively arranged instead of or along with being formed the former side. In this case, the loading terminal 102 is formed along the both sides or any one side of the element substrate 10 where the Y-side driving circuit unit 132 is arranged and the input/output signal line 118 and the cathode wiring line 200 are formed and the wiring material 300 is loaded on the loading terminal 102 in the same way shown in FIG. 1.

In addition, the laminating order among the plurality of input/output signal lines 118, the cathode 49, and the cathode wiring line 200 on the element substrate 10 are not limited to the structure shown in FIG. 7. For example, the plurality of input/output signal lines 118 may be formed above the cathode wiring line 200 on the element substrate 10. Moreover, in the case of the structure of the pixel shown in FIGS. 3 and 4, the cathode serving as the "first electrode" according to the present invention may be formed on every pixel, and the anode serving as the "second electrode" according to the present invention on the sealing substrate facing against the plurality of cathodes.

<2: Second Embodiment>

Figure 9:
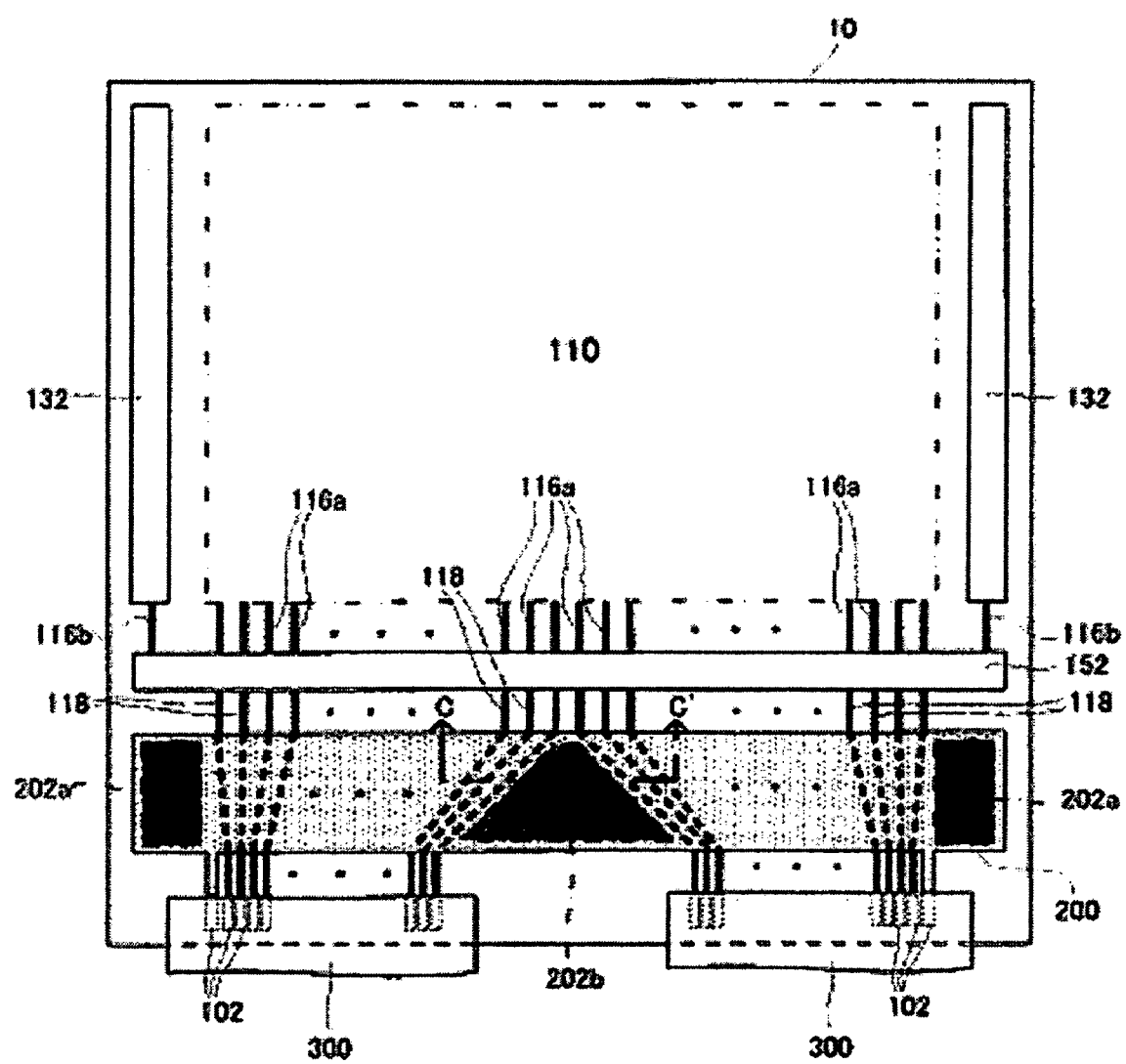
FIG. 9 is a rough plan view of the element substrate of an organic EL device according to the second embodiment when it is seen from the sealing substrate.
Figure 10:
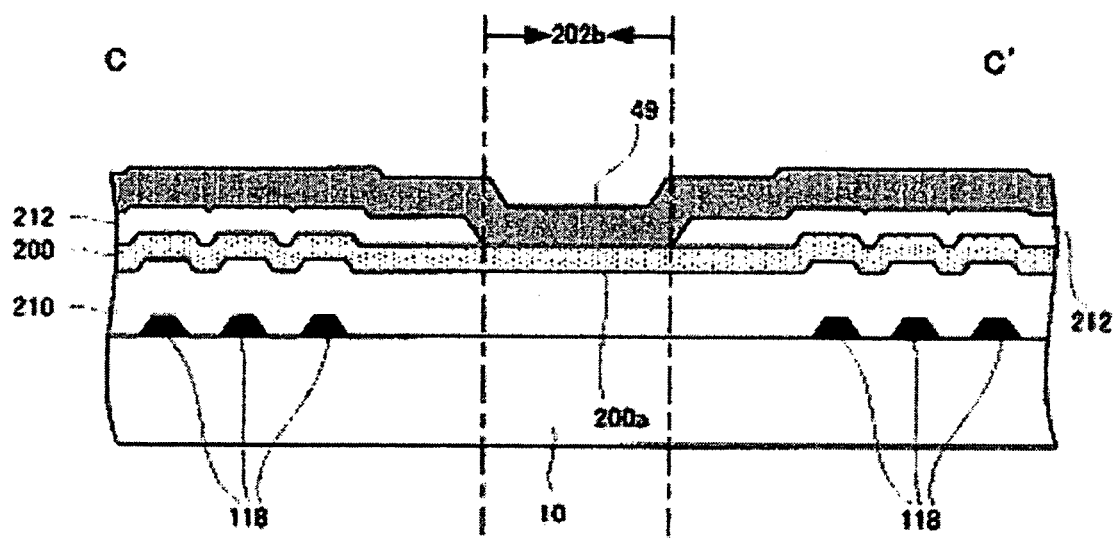
FIG. 10 is a sectional view along the C–C' line shown in FIG. 9.

Next, a second embodiment according to the organic EL device of the present invention will be described. According to the second embodiment, the structure of the plurality of input/output signal lines 118 in a part of the peripheral region is different from that of the first embodiment. Thus, only a different point therebetween will be described below with reference to FIGS. 9 and 10. FIG. 9 is a schematic plan view of the element substrate of the organic EL device according to the second embodiment when it seen from the sealing substrate, and FIG. 10 is a sectional view along C–C' line shown in FIG. 9. Here, the same numerals are given for the same parts as the first embodiment and the explanation thereon will be omitted.

The plurality of input/output signal lines 118 are divided into a plurality of signal line groups which contain 1 or more input/output signal lines 118. As shown in FIG. 9, the plurality of input/output signal lines 118 may be divided into, for example, two signal line groups. And the other ends of the plurality of input/output signal lines 118 which are connected to the loading terminals 102 are collected into every signal line groups. An open area 202b where there is no input/output signal line 118 is formed in a part of the peripheral region which is located between two adjacent signal line groups, in the plan view seen from the element substrate 10. Moreover, as same as the comparative example shown in FIG. 8, open areas are formed on both sides of plurality of input/output signal lines 118 regardless whether the plurality of input/output signal lines 118 are collectively arranged or not. With reference to FIG. 9, since the plurality of input/output signal lines 118 are collectively arranged and thus, open area 202a with a relatively bigger size is formed in the same way as the first embodiment.

According to the second embodiment, open areas 202a and 202b are formed to serve as a contact area. In FIG. 10, there is no the input/output signal lines 118 right under a part of the cathode wiring line 200 which is formed in the open are 202b. Thus, when the open area 202b is used as the contact area, the contact 200a of the cathode wiring line 200 can be formed flat.

The loading terminals 102 are arranged at every signal line group. Therefore, the structure of the loading terminals may be changeable as the plurality of input/output signal lines 118 are divided into the plurality of signal line groups. For example, as shown in FIG. 9, when the plurality of input/output signal lines 118 are divided into two signal line groups, the wiring substrate 300 is mounted in the loading terminal corresponding to each signal line group. That is, in this case, two wiring substrates 300 with external circuits respectively were mounted in the loading terminals 102. The wiring substrate 300 can be allotted for a predetermined number of signal line groups so that the wiring substrate 300 is mounted in every loading terminal 102 corresponding to the predetermined number of signal line groups. Like this, since the plurality of wiring substrates 300 is mounted in the plurality of loading terminals 102, the external circuit on the loading side, the wiring substrate 300 etc. can be made into a smaller size. Thus, according to the second embodiment, the organic EL device can be miniaturized.

<3: Electronic Apparatus>

Next, various kinds of electric apparatuses employing the above-mentioned organic EL device will be described below.

<3-1: Mobile Computer>

Figure 11:
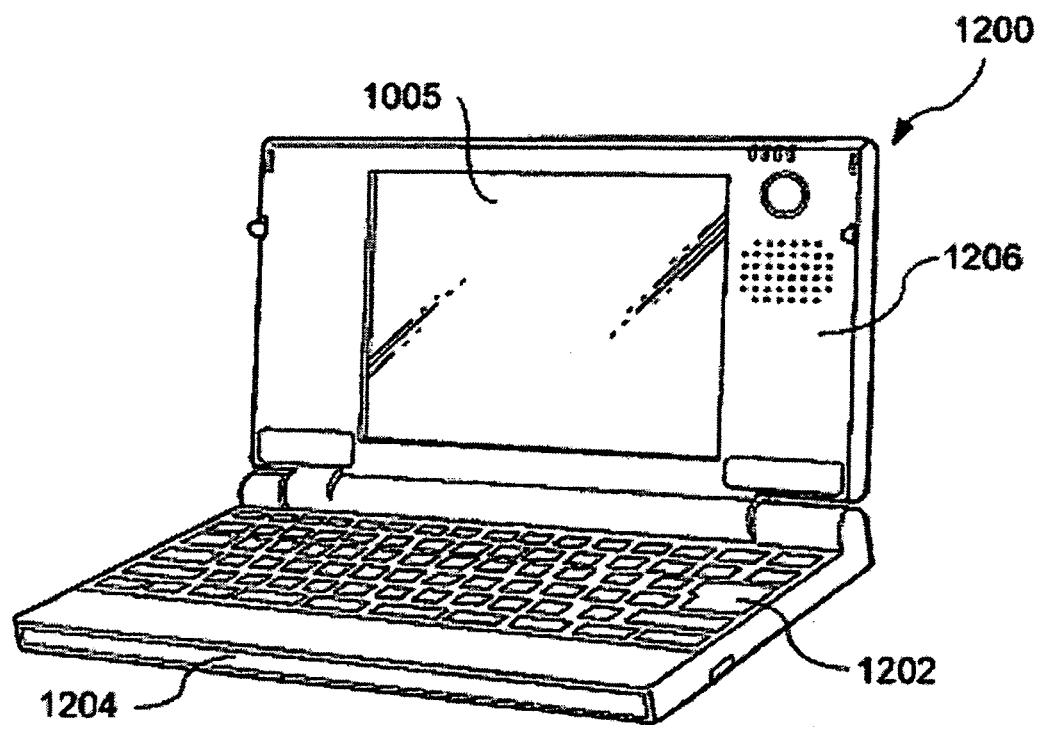
FIG. 11 is a sectional view showing the structure of a personal computer which is exemplified as an electronic device employing the organic EL device according to the present invention.

First, an example where the organic EL device is employed for a mobile type personal computer will be described. FIG. 11 is a perspective view showing the structure of the personal computer. As shown in FIG. 11, the computer 1200 is equipped with a main body 1204 with the keyboard 1202, and a display unit 1206 formed of organic EL device.

<3-2: Cellular-Phone>

Figure 12:
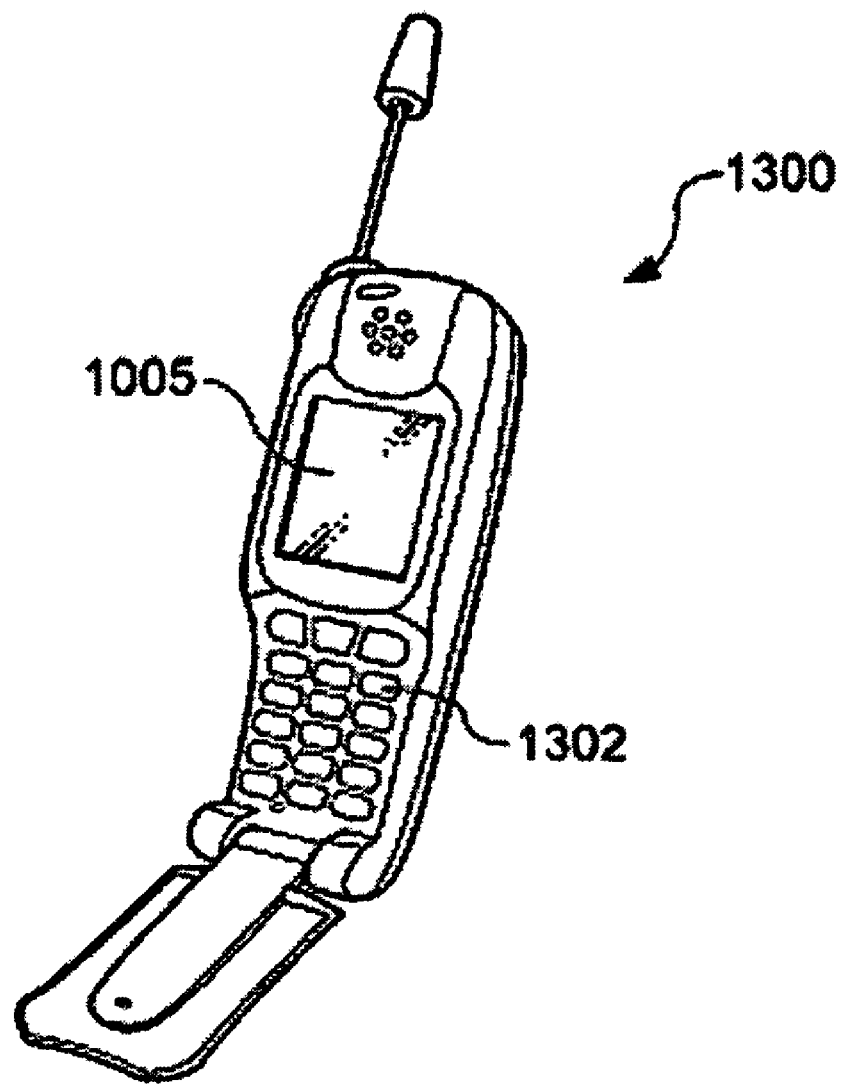
FIG. 12 is a sectional view showing the structure of a cellular phone which is exemplified as an electronic device employing the organic EL device according to the present invention.

Another example where the organic EL device is employed for a cellular phone will be described. FIG. 12 is a perspective view showing the structure of a cellular phone. As shown in FIG. 12, a cellular phone 1300 is equipped with a plurality of operation buttons 1302 and an organic EL device. In FIG. 12, a figure numeral 1005 is given to the organic EL device.

Besides, an organic EL device is applicable for a note type personal computer, a PDA, a television, a view finder type or a monitor attached type video tape recorder, car navigation equipment, a pager, an electronic notebook, a calculator, a word processor, a workstation, a POS terminal, and device with a touch panel etc.

This invention is not restricted to the above-mentioned embodiment, and can be suitably changeable in the range which is not contrary to the scope or the idea of the present invention which is conceivable from the whole specification and the claim, and an organic EL device changed in that range and various electronic devices employing the changed organic EL device are also within the scope of the present invention.

What is claimed is:

1. An electro-optical device comprising:
   a plurality of pixel driving signal lines arranged in an image display region on a substrate,
   a plurality of first electrodes each of which is formed on each pixel in the image display region and electrically connected to the pixel driving signal line,
   a second electrode formed so as to face the plurality of first electrodes and be extended from the pixel display region onto a peripheral region located around the pixel display region,
   a luminescent layer interposed between the first electrodes and the second electrode, for each pixel,
   a plurality of input/output signal lines arranged in the peripheral region, one ends of which are electrically connected to the pixel driving signal lines and the other ends of which are electrically connected to external circuits for driving the pixel driving signal lines, and
   a wiring line for the second electrode arranged in the peripheral region and electrically connected to the second electrode,
   wherein, at least a part of the plurality of input/output signal is collectively arranged in the peripheral region in the direction from the one end to the other end to form a contact area on which no input/output signal lines exist, and
   the wiring line for the second electrode includes a contact which is positioned on the contact area so as to electrically connect the wiring line for the second electrode to the second electrode.

2. An electro-optical device according to claim 1,
   wherein the other end of the plurality of input/output signal lines is collectively arranged in a part of the peripheral region located on the one side around the image display region, and
   the contact area is formed in the part of the peripheral region.

3. An electro-optical device according to claim 1,
   wherein the plurality of input/output signal lines are divided into a plurality of signal line groups each of which contains a part of the plurality of input/output signal lines,
   the other ends in each signal line group are collected, and
   the contact area includes an area between two adjacent signal line groups.

4. An electro-optical device according to claim 1,
wherein the wiring line for the second electrode is arranged to be extended from the contact to a region in the peripheral region where the plurality of input/output signal lines are arranged.

5. An electro-optical device according to claim 1, wherein the plurality of input/output signal lines are arranged under the wiring line for the second electrode on the substrate, and at least a part of the wiring line for the second electrode is arranged above the plurality of input/output signal lines in the peripheral region in the direction across or along the plurality of input/output signal lines, an interlayer insulating layer being interposed therebetween.

6. An electronic apparatus comprising the electro-optical device according to claim 1.

* * * * *

UNITED STATES PATENT AND TRADEMARK OFFICE
CERTIFICATE OF CORRECTION

PATENT NO. : 7,129,645 B2
APPLICATION NO. : 11/106542
DATED : October 31, 2006
INVENTOR(S) : Junichi Wakabayashi It is certified that error appears in the above-identified patent and that said Letters Patent is hereby corrected as shown below:

In claim 1:
    Col. 14, line 29, change "connected to the pixel driving signal line" to --connected to a corresponding one of the pixel driving signal lines--;
    Col. 14, line 45, after "signal" insert --lines--.

In claim 2:
    Col. 14, line 54, change "other end" to --other ends--.

Signed and Sealed this

Twenty-sixth Day of August, 2008

JON W. DUDAS
*Director of the United States Patent and Trademark Office*